(12) United States Patent
Heuser et al.

(10) Patent No.: US 9,428,834 B2
(45) Date of Patent: Aug. 30, 2016

(54) CERAMIC BARRIER LAYERS

(71) Applicant: Osram Opto Semiconductors GmbH, Regensburg (DE)

(72) Inventors: Karsten Heuser, Erlangen (DE); Georg Wittmann, Herzogenaurach (DE); Guenter Gieres, Kleinsendelbach (DE); Ralph Paetzold, Roth (DE); Debora Henseler, Erlangen (DE)

(73) Assignee: OSRAM OLED GmbH, Regensberg (DE)

( * ) Notice: Subject to any disclaimer, the term of this patent is extended or adjusted under 35 U.S.C. 154(b) by 39 days.

(21) Appl. No.: 14/333,680

(22) Filed: Jul. 17, 2014

(65) Prior Publication Data

US 2014/0329026 A1   Nov. 6, 2014

Related U.S. Application Data

(63) Continuation of application No. 10/789,712, filed on Mar. 10, 2004, now abandoned.

(30) Foreign Application Priority Data

Mar. 10, 2003   (EP) .................................... 03005270

(51) Int. Cl.
| | |
|---|---|
| *C23C 16/00* | (2006.01) |
| *C23C 16/56* | (2006.01) |
| *B32B 27/00* | (2006.01) |
| *C23C 14/22* | (2006.01) |
| *C23C 16/44* | (2006.01) |

(52) U.S. Cl.
CPC ............. *C23C 16/56* (2013.01); *B32B 27/00* (2013.01); *C23C 14/22* (2013.01); *C23C 16/44* (2013.01)

(58) Field of Classification Search
None
See application file for complete search history.

(56) References Cited

U.S. PATENT DOCUMENTS

| | | | |
|---|---|---|---|
| 5,792,550 A | 8/1998 | Phillips et al. | |
| 6,291,272 B1 * | 9/2001 | Giri ..................... | H01L 21/4857 438/108 |
| 6,413,645 B1 | 7/2002 | Graff et al. | |
| 6,522,067 B1 * | 2/2003 | Graff ................... | H01L 51/5237 313/504 |
| 2003/0194859 A1 | 10/2003 | Huang | |
| 2003/0203210 A1 * | 10/2003 | Graff ................... | H01L 51/0097 428/412 |
| 2004/0131865 A1 * | 7/2004 | Kim ......................... | C23C 4/02 428/433 |

(Continued)

FOREIGN PATENT DOCUMENTS

| | | |
|---|---|---|
| EP | 0727505 | 8/1998 |
| JP | 04-014440 | 1/1992 |

(Continued)

OTHER PUBLICATIONS

JP 2001-277420, machine translation.*

(Continued)

*Primary Examiner* — Robert Vetere
(74) *Attorney, Agent, or Firm* — Fish & Richardson P.C.

(57) ABSTRACT

Forming an arrangement of two ceramic barrier layers (5, 10) on a polymeric substrate (1) includes the steps of applying a first ceramic barrier layer (5) on the substrate (1). The surface (5A) of the first barrier layer (5) is modified to introduce new nucleation sites on the surface of the first layer. A second ceramic barrier layer (10) is formed on the first barrier layer (5) using the new nucleation sites. The second ceramic barrier layer is deposited with independent nucleation sites such that a barrier stack of enhanced quality is formed.

32 Claims, 1 Drawing Sheet

(56) References Cited

U.S. PATENT DOCUMENTS

2004/0208994 A1* 10/2004 Harkonen ............... C23C 16/32
427/249.1
2004/0239241 A1   12/2004 Wittmann et al.

FOREIGN PATENT DOCUMENTS

| JP | 05-341324 | 12/1993 |
|---|---|---|
| JP | 11-105189 | 4/1999 |
| JP | 2001-277420 | 10/2001 |
| JP | 2002-056773 | 2/2002 |
| JP | 2002-532850 | 10/2002 |
| WO | WO 00/48749 | 8/2000 |
| WO | WO 01/81649 | 11/2001 |

OTHER PUBLICATIONS

JP H11-105189, machine translation.*

Weaver, M.S., "Organic light-emitting devices with extended operating lifetimes on plastic substrates", Oct. 2002, Applied Physics Letters, vol. 81, No. 16, pp. 2929-2931.

Intermediate Official Letter in Japanese Patent Application No. 2004-066095, dated May 21, 2010, 4 pages.

* cited by examiner

CERAMIC BARRIER LAYERS

CROSS-REFERENCE TO RELATED APPLICATIONS

This application is a continuation application of and claims priority to U.S. application Ser. No. 10/798,712, now abandoned, filed on Mar. 10, 2004; which claims priority to European Patent Application No. 03005270.8, filed on Mar. 10, 2003. The disclosures of the prior applications are incorporated by reference herein in their entirety.

BACKGROUND

Many products, for example food, electronic devices and pharmaceuticals, are very sensitive to moisture and oxidizing agents. Many of these products rapidly degrade when exposed to water, oxidizing agents or other gases or liquids. Polymeric substrates, such as polymeric foils, are often used to package these products. These foils frequently exhibit a permeability for water vapor and for oxidizing agents in the range of more than 1 $g/(m^2 *day)$. This high degree of permeability is unacceptable for most of the products packaged in polymer foils.

One packaging application that uses polymeric substances is the packaging of organic electroluminescent devices (OLEDs). An OLED device includes a functional stack formed on a substrate. The functional stack includes at least one organic functional layer sandwiched between two conductive layers. The conductive layers serve as electrodes (cathode and anode). When a voltage is applied to the electrodes, charge carriers are injected through these electrodes into the functional layers and upon recombination of the charge carriers, visible radiation can be emitted (electroluminescence). The functional stack of the OLED is very sensitive to moisture and oxidizing agents, which can cause oxidation of the metals of the electrodes or deterioration of the organic functional layers. The next generation of organic electroluminescent devices are likely to be arranged on flexible substrates, such as polymeric substrates, and are under current investigation. For a sufficient OLED lifetime, polymeric substrates with a permeability for water or oxidizing agents below $10^{-6}$ $g/(m^2$ day) are desirable.

Patent application WO 00/48749 A1 describes a method of reinforcing polymeric foils with thin ceramic barrier layers in order to block out gases or liquids more efficiently than when only polymeric foils are used. Ceramic layers frequently have defects in their microstructures that can serve as continuous paths for gases and water vapor to pass through the ceramic barrier layers. These defects lead to a decreased ability of the ceramic barrier layers to serve as a barrier. In this context, all pathways through the inorganic, ceramic barrier layers are called defects. Defects in the context of this specification include pinholes, grain boundaries, shadowing effects, and impurities, as well as other imperfections in a material.

Patent publication WO 01/81649 A1 describes a method of depositing several thin ceramic barrier layers on top of each other on polymeric substrates to enhance the barrier abilities of the polymeric substrates. This publication suggests decoupling defects in successive ceramic barrier layers by changing the deposition parameters and growth conditions for the deposition of the ceramic barrier layers. According to the publication, this method should lead to mismatched subsequent barrier layers that exhibit different microstructures and therefore the paths for gases and water vapor permeation are degraded, leading to enhanced barrier abilities. Experiments carried out by the inventors indicate that ceramic barrier stacks produced by this method exhibit enhanced barrier abilities, but show no major improvements over applying a single ceramic barrier layer when defects larger than grain boundaries, e.g., pinholes or shadowing effects, are present.

SUMMARY

There is a need for polymeric substrates with improved barrier abilities. The present invention can meet these needs by forming an arrangement of barrier layers on a polymeric substrate.

Methods for forming an arrangement of two ceramic barrier layers on a polymeric substrate are described. In one implementation, the method includes applying a first barrier layer on a substrate. The surface of the first barrier layer is then modified to introduce new nucleation sites on the surface of the first layer. A second ceramic barrier layer is then formed on the first barrier layer using the new nucleation sites.

Aspects of the techniques described herein may include none, or one or more, of the following advantages. The new nucleation sites on the first barrier layer can serve as a starting point for the formation of the second ceramic barrier layer. Due to thermodynamics, the second ceramic barrier layers can be formed on the first barrier layers without continuing all the defects, such as pinholes and grains, of the first layer throughout the barrier layer. At least two thermodynamically decoupled layers may be grown on top of each other with independent nucleation for each layer.

Using methods described herein changes the grain boundaries on the surface of the first ceramic barrier layer. Because the grain boundaries can be reproduced in the second layer if no new nucleation is introduced, then the defects may form a path for water and oxidizing agents to travel through the ceramic barrier layers. Introducing new nucleation sites can ensure that subsequent layers can be formed on a ceramic barrier layer independent from the morphology and the energetic conditions of the ceramic layer. The nucleation can be sensitive to the kinetic energy and mobility of the molecules on the surface of a layer on an atomic scale. An arrangement of at least two ceramic barrier layers on a polymeric substrate formed by the methods described herein may be less permeable for gases and liquids than barrier stacks produced by conventional methods.

DETAILED DESCRIPTION

Figure 1A:
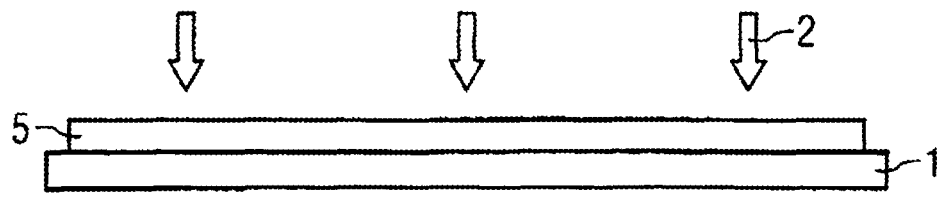
FIGS. 1A to 1C show one embodiment of the inventive method in a cross-sectional view.

A method for forming an arrangement of two ceramic barrier layers on a polymeric substrate includes applying a first barrier layer on the substrate. The surface of the first barrier layer is then modified to introduce new nucleation sites on the surface of the first layer. A second ceramic barrier layer is then formed on the first barrier layer using the new nucleation sites.

The introduction of new nucleation sites on the surface of the first layer can be performed by chemical surface modification, mechanical surface modification or by the application of nucleation-promoting material on the surface of the first layer. The chemical surface modification can be performed by saturating "dangling" unsaturated bonds on the surface of the first layer or by changing the lattice parameters of the surface of the first layer by, e.g., oxidation. Alternatively, or in addition, the chemical surface modification can include acid treatment, base treatment, water vapor treatment, plasma treatment or ozone treatment. These modification methods can change the surface and introduce new nucleation sites on the surface of the first layer very efficiently.

Modifying the surface mechanically can include ion-milling, nano-grinding, melting the surface with a laser-beam or tempering. During ion-milling, the surface of a barrier layer can be treated with ion beams, such as argon ion beams or oxygen ion beams, to change the topology of the surface. During nano-grinding, the surface of the barrier layer can be polished using abrasive particles sized in the nanometer range. Tempering includes curing barrier layer by applying temperatures higher than temperatures applied during the formation of the barrier layer and to at least a partial rearrangement of the crystal lattice of the surface of this layer. Melting the surface with a laser-beam involves melting areas of the first ceramic barrier layer to rearrange the crystal lattice.

The surface of the a ceramic barrier layer can also be doped with nucleation promoting materials. The materials can be selected to have a small critical nucleus. The critical nucleus can include a single atom or molecule. The critical nucleus denotes the minimum number of atoms or molecules required to form a stable grain. The nucleation promoting materials can be selected from a group of metals, metal nitrides, metal oxides, silicon, silicon nitride and silicon oxide. Specifically, nucleation promoting materials can be selected from tantalum, chromium, tungsten, molybdenum, niobium, titanium, tantalum nitride, titanium nitride, tantalum oxide and titanium oxide. These materials are able to serve as nucleation sites for the growth of the second ceramic barrier layer. The nucleation promoting materials do not have to build up a continuous layer on the surface of the ceramic barrier layer. The deposited amount of nucleation promoting material on the surface of the first layer can be below the mass needed to create a monomolecular layer, i.e., the surface of the ceramic barrier layer need only be doped with the nucleation promoting material.

In one implementation, a ceramic material that is selected from one or more materials of a metal, metal oxides, metal nitrides, metal oxynitrides, silicon, silicon oxides, silicon nitrides and silicon oxynitrides is used to form ceramic barrier layers. The metal for these metal nitrides, metal oxides or metal oxynitrides can be aluminum. These ceramic materials are able to serve as barrier layers that block out gases or liquids. Apart from these materials, other ceramic materials including predominately inorganic and non-metallic compounds or elements can be used. Each ceramic barrier layer can be of the same material. Alternatively, each ceramic barrier layer can include a different material than the other ceramic barrier layers.

Forming subsequent ceramic barrier layers can include deposition techniques, such as chemical vapor deposition (CVD) or physical vapor deposition (PVD). These methods can be used to deposit ceramic barrier layers of high quality on substrates.

The first barrier layer can be formed on a flexible, transparent substrate, e.g., polyethyleneterepthalate (PET). In one implementation, flexible, transparent substrates are used in organo-optical devices, such as the abovementioned OLEDs, because these substrates can be transparent to the light emitted by the OLEDs.

In one implementation, a third ceramic barrier layer is deposited on the surface of the second ceramic barrier layer by repeating the steps of introducing nucleation sites and forming a barrier layer using the new nucleation sites. In this implementation, the surface of the second ceramic barrier layer is also modified in order to introduce new nucleation sites. These new nucleation sites can serve as starting points for the deposition of the third ceramic barrier layer. An arrangement with three or more ceramic barrier layers can be used for applications where an extremely low permeation rate through the barrier layers for gases and liquids is necessary.

In forming the first, second and subsequent barrier layers, the barrier layers can have a thickness of about 1 to about 250 nm, such as a thickness of about 10 to 100 nm. Such thin layers can be used as barrier layers, for example, for transparent substrates on flexible OLED devices, because the light emitted by the OLED can pass through the thin barrier layers.

In one implementation, the arrangement of the ceramic barrier layers on the polymeric substrate produced by the methods described above can be used to build up organic electrical devices, such as integrated plastic circuits or flexible organic light sensors such as organic solar cells or photodetectors. Therefore it is possible to form an organic functional layer after forming the second barrier layer. In this implementation, the arrangement of the substrate and the ceramic barrier layers can serve as a barrier stack to protect the sensitive organic functional layer from moisture or oxidizing agents.

In another implementation, subsequent steps of forming an OLED are performed. A first electrically conductive layer can be formed on the second barrier layer, and a functional organic layer can be formed on the first electrically conductive layer. A second electrically conductive layer can be formed on the functional organic layer. The conductive layers, which, for example, can comprise indium-tin oxide (ITO), can easily be patterned, e.g., to form stripes. The first electrically conductive layer can be patterned into a plurality of parallel electrode stripes, whereas the second electrically conductive layer can also be formed into a plurality of parallel electrode stripes running perpendicular to the electrode stripes of the first conductive layer. The crossing points between the electrode stripes of the first and of the second conductive layers can form pixels of the OLED device.

Furthermore, it is possible to form an encapsulation over an OLED device that is built up on a barrier arrangement. Encapsulation can include forming a fourth ceramic barrier layer over the second electrically conductive layer of the OLED device. The surface of the fourth barrier layer is subsequently modified to introduce new nucleation sites on the surface. Afterwards, a fifth ceramic barrier layer is formed on the fourth ceramic barrier layer. A similar encapsulation method can be use with other electrical devices FIG. 1A shows a first ceramic barrier layer 5 formed on a substrate 1. The arrows 2 denote the formation of the first ceramic barrier layer 5.

Figure 1B:
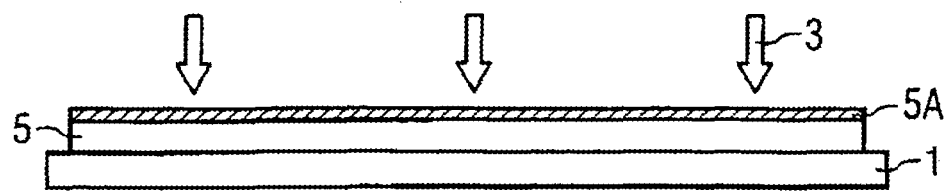

FIG. 1B is a cross-sectional view of the substrate 1 with one barrier 5 layer having a modified surface 5A. The surface 5A of the first ceramic barrier layer 5 is modified by chemical or mechanical modification or by introduction of nucleation promoting material to introduce new nucleation sites. The arrows 3 denote the direction of the surface modification.

Figure 1C:
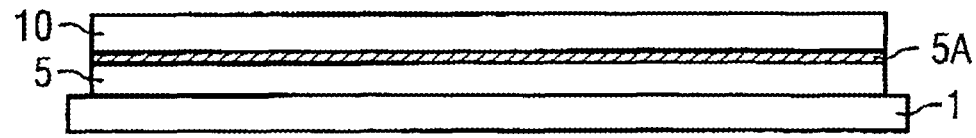

FIG. 1C shows an arrangement of the substrate 1, the first ceramic barrier layer 5 and the second ceramic barrier layer 10 after depositing the second barrier layer 10. The second ceramic barrier layer 10 is deposited on the modified surface 5A of the first ceramic barrier layer 5. The new nucleation sites of the surface 5A cause the first barrier layer to have a different morphology in the areas of the first ceramic barrier layer 5 that are located below the surface 5A as the corresponding portions of the surface. The second layer 10 can be grown on the first ceramic barrier layer with independent nucleation and different grain boundaries.

Figure 2:
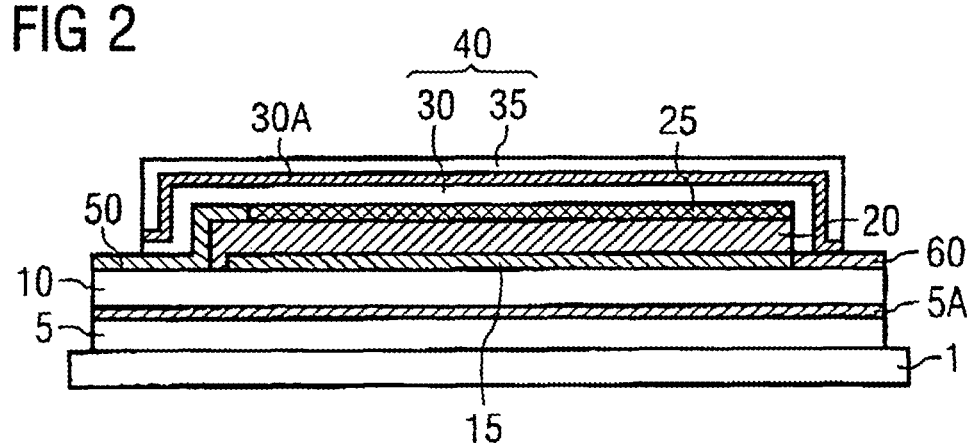
FIG. 2 shows a cross-section of an OLED device produced according to one embodiment of the method of the invention.

FIG. 2 is a cross-sectional view of an OLED device formed by methods described herein. The electrical functional stack of the OLED device has at least one organic functional layer 20 inserted between a first electrically conductive layer 15 and a second electrically conductive layer 25. The electrical, functional stack is formed on a barrier arrangement consisting of the polymeric substrate 1, the first ceramic barrier layer 5 and the second ceramic barrier layer 10, which is deposited on the modified surface 5A of the first ceramic barrier layer using new nucleation sites. An encapsulation 40 consisting of the third ceramic barrier layer 30 and the fourth ceramic barrier layer 35 is formed on top of the electrical, functional stack of the OLED device, sealing the electrical, functional stack of the device from the environment. The surface 30A of the third ceramic barrier layer 30 includes the nucleation sites for forming the fourth ceramic barrier layer 40. Contact pads 50, 60, which are connected to the first 15 and the second electrically conductive layer 25 are present to enable an electrical connection to the OLED. Therefore, the methods described above can provide an OLED device with enhanced lifetime and can be formed with a tight encapsulation.

What is claimed is:

1. A method for forming an arrangement of two barrier layers on a substrate, comprising:
forming a first ceramic barrier layer on the substrate, wherein the first ceramic barrier layer has a first surface and a second surface and the first surface is closer to the substrate than the second surface;
modifying at least a portion of the second surface of the first ceramic barrier layer such that the second surface of the first ceramic barrier layer comprises a material different from the material of the first ceramic barrier layer below the second surface to introduce first nucleation sites on the second surface, including depositing a nucleation-promoting material onto the second surface, the first nucleation sites including the nucleation-promoting material; and
forming a second ceramic barrier layer directly on the second surface of the first ceramic barrier layer without continuing all defects of the first ceramic barrier layer, wherein the second ceramic barrier layer is initiated at the first nucleation sites;
wherein the first ceramic barrier layer and the second ceramic barrier layer together have enhanced barrier capabilities against gas and liquid as compared to two similar adjacent ceramic barrier layers formed without the modifying step to introduce nucleation sites.

2. The method of claim 1, wherein: modifying at least a portion of the second surface of the first ceramic barrier layer includes chemically modifying the second surface.

3. The method of claim 2, wherein: chemically modifying at least a portion of the second surface of the first ceramic barrier layer includes at least one modification technique from the group consisting of acid treatment, base treatment, exposure to water vapor, plasma treatment and ozone treatment.

4. The method of claim 1, wherein: modifying at least a portion of the second surface of the first ceramic barrier layer further includes mechanically modifying the second surface.

5. The method of claim 4, wherein: mechanically modifying at least a portion of the second surface of the first ceramic barrier layer includes at least one modification technique from the group consisting of ion milling, nano-grinding, melting the second surface with a laser and tempering.

6. The method of claim 1, wherein: modifying at least a portion of the second surface of the first ceramic barrier layer includes forming a nucleation promoting material on the second surface.

7. The method of claim 1, wherein: forming a nucleation promoting material on at least a portion of the second surface of the first ceramic barrier layer includes forming at least one material from the group consisting of a metal, a metal nitride and a metal oxide.

8. The method of claim 7, wherein: forming the at least one material includes applying a material with a critical nucleus of one atom.

9. The method of claim 8, wherein: forming the at least one material includes applying at least one material from the group consisting of tantalum, chromium, tungsten, molybdenum, and niobium.

10. The method of claim 7, wherein: applying the at least one material includes applying a material with a critical nucleus of one molecule.

11. The method of claim 10, wherein: forming at least one material includes applying at least one of the materials from the group consisting of tantalum nitride, titanium nitride, tantalum oxide and titanium oxide.

12. The method of claim 1, wherein: forming a first ceramic barrier layer and a second ceramic barrier layer includes forming the first and second ceramic barrier layers of at least one material from the group consisting of a metal nitride, a metal oxide and a metal oxynitride.

13. The method of claim 12, wherein: the metal is aluminum.

14. The method of claim 1, wherein: forming a first ceramic barrier layer and a second ceramic barrier layer includes forming the first and second ceramic barrier layers of at least one material from the group consisting of silicon nitride, silicon oxide and silicon oxynitride.

15. The method of claim 1, wherein: forming a second ceramic barrier layer includes depositing the second ceramic barrier layer using chemical vapor deposition.

16. The method of claim 1, wherein: forming a second ceramic barrier layer includes depositing the second ceramic barrier layer using physical vapor deposition.

17. The method of claim 1, wherein: forming the first ceramic barrier layer includes at least one technique selected from the group consisting of laminating, printing, sputtering, spraying, chemical vapor deposition and physical vapor deposition.

18. The method of claim 1, wherein: the substrate includes a flexible transparent substrate.

19. The method of claim 1, wherein the second ceramic barrier layer has a first surface and a second surface and the first surface of the second ceramic barrier layer is closer than the second surface to the first ceramic barrier layer, the method further comprising:

modifying at least a portion of the second surface to introduce second nucleation sites on the second surface of the second ceramic barrier layer; and forming a third ceramic barrier layer on the second ceramic barrier layer, wherein the third ceramic barrier layer is initiated at the second nucleation sites.

20. The method of claim 1, wherein: forming a first ceramic barrier layer includes forming the layer to be between about 1 and about 250 nanometers thick.

21. The method of claim 1, wherein: forming a second ceramic barrier layer includes forming the layer to be between about 1 and about 250 nanometers thick.

22. The method of claim 1, wherein: forming a first ceramic barrier layer includes forming the layer to be between about 10 and about 100 nanometers thick.

23. The method of claim 1, wherein: forming a second ceramic barrier layer includes forming the layer to be between about 10 and about 100 nanometers thick.

24. The method of claim 1, further comprising: forming an organic electrical device on the second ceramic barrier layer.

25. The method of claim 1, further comprising: forming a first electrically conductive layer on the second ceramic barrier layer;

forming a functional organic layer on the first electrically conductive layer; and forming a second electrically conductive layer on the functional organic layer.

26. The method of claim 25, further comprising: forming an encapsulation over the second electrically conductive layer such that the functional organic layer is sealed from the environment by the encapsulation.

27. The method of claim 26, wherein forming an encapsulation comprises:

forming a third ceramic barrier layer over the second electrically conductive layer, wherein the third ceramic barrier layer has a first surface and a second surface and the first surface is closer than the second surface to the second electrically conductive layer;

modifying the second surface of the third ceramic barrier layer to introduce third nucleation sites on the surface of the third ceramic barrier layer; and forming a fourth ceramic barrier layer on the third ceramic barrier layer, wherein the fourth ceramic barrier layer is initiated at the third nucleation sites.

28. The method of claim 1, wherein: the nucleation sites introduced on the second surface consist of a material different from material of the first ceramic barrier layer.

29. The method of claim 1, wherein: the material of the added nucleation promoting material is different from the material of the first ceramic barrier layer.

30. The method of claim 1, wherein the nucleation-promoting material is selected from a group consisting of metals, metal nitrides, metal oxides, silicon, silicon nitride and silicone oxide.

31. The method of claim 30, wherein the nucleation-promoting material is selected from a group consisting of tantalum, chromium, tungsten, molybdenum, niobium, titanium, tantalum nitride, titanium nitride, tantalum oxide and titanium oxide.

32. The method of claim 1, wherein the deposited amount of nucleation-promoting material on the surface of the first layer is below the mass needed to create a monomolecular layer.

* * * * *